US008565354B2

(12) United States Patent
Chang et al.

(10) Patent No.: US 8,565,354 B2
(45) Date of Patent: *Oct. 22, 2013

(54) DIGITAL BROADCASTING TRANSMISSION/RECEPTION DEVICES CAPABLE OF IMPROVING A RECEIVING PERFORMANCE AND SIGNAL PROCESSING METHOD THEREOF

(75) Inventors: Yong-deok Chang, Suwon-si (KR); Hae-joo Jeong, Seoul (KR); Joon-soo Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 4 days.

This patent is subject to a terminal disclaimer.

(21) Appl. No.: 12/260,736

(22) Filed: Oct. 29, 2008

(65) Prior Publication Data

US 2009/0122741 A1 May 14, 2009

Related U.S. Application Data

(62) Division of application No. 11/587,924, filed as application No. PCT/KR2005/001398 on May 12, 2005.

(30) Foreign Application Priority Data

May 13, 2004 (KR) .................................. 2004-33990
May 11, 2005 (KR) .................................. 2005-39309
May 11, 2005 (KR) .................................. 2005-39317

(51) Int. Cl.
*H04L 27/06* (2006.01)
(52) U.S. Cl.
USPC ........... 375/340; 375/295; 375/265; 375/253; 375/263; 375/316; 375/324

(58) Field of Classification Search
USPC .......... 375/340, 295, 265, 253, 263, 316, 324
See application file for complete search history.

(56) References Cited

U.S. PATENT DOCUMENTS 5,877,816 A * 3/1999 Kim .............................. 348/526
6,608,870 B1 8/2003 Fimoff
(Continued)

FOREIGN PATENT DOCUMENTS

CN 1149795 A 5/1997
CN 1168053 A 12/1997
(Continued)

OTHER PUBLICATIONS

Chinese Office Action issued Mar. 20, 2009 in CN Application No. 200580015387.7.

(Continued)

*Primary Examiner* — Kabir A Timory
(74) *Attorney, Agent, or Firm* — Sughrue Mion, PLLC

(57) ABSTRACT

Disclosed is a digital broadcasting transmission/reception system having an improved reception performance and in a signal-processing method thereof. A digital broadcasting transmitter comprises a TS stream generator for inputting robust and normal packets having stuff bytes in predetermined positions and generating dual TS stream by inserting the robust packets between the normal packets; a randomizer for randomizing the dual TS stream; a stuff byte exchanger for replacing the stuff bytes of a randomized data streams from the randomizer to a predetermined known data; and an encoder for encoding a data streams to which the known data is inserted. Accordingly, the present invention detects the known data from a signal received from a reception side and uses the detected known data for synchronization and equalization, so that the digital broadcasting reception performance can be improved at poor multipath channels.

18 Claims, 14 Drawing Sheets

(56) References Cited

U.S. PATENT DOCUMENTS

| | | | |
|---|---|---|---|
| 6,810,084 B1 * | 10/2004 | Jun et al. | 375/240.28 |
| 2002/0140867 A1 | 10/2002 | Weiss | |
| 2002/0172277 A1 * | 11/2002 | Choi et al. | 375/240.01 |
| 2002/0186780 A1 | 12/2002 | Choi et al. | |
| 2003/0099303 A1 | 5/2003 | Birru et al. | |
| 2004/0032529 A1 * | 2/2004 | Jeon et al. | 348/571 |
| 2004/0090352 A1 | 5/2004 | Jaffe et al. | |
| 2004/0109092 A1 * | 6/2004 | Markman et al. | 348/726 |
| 2005/0162886 A1 * | 7/2005 | Jeong et al. | 365/63 |
| 2007/0268979 A1 | 11/2007 | Chang et al. | |
| 2009/0122741 A1 | 5/2009 | Chang et al. | |
| 2009/0122892 A1 | 5/2009 | Chang et al. | |
| 2009/0122893 A1 | 5/2009 | Chang et al. | |
| 2009/0122894 A1 | 5/2009 | Chang et al. | |
| 2009/0122908 A1 | 5/2009 | Chang et al. | |
| 2009/0122920 A1 | 5/2009 | Chang et al. | |
| 2009/0122922 A1 | 5/2009 | Chang et al. | |
| 2009/0122923 A1 | 5/2009 | Chang et al. | |
| 2009/0135936 A1 | 5/2009 | Chang et al. | |
| 2009/0147889 A1 | 6/2009 | Chang et al. | |

FOREIGN PATENT DOCUMENTS

| | | |
|---|---|---|
| CN | 1954605 | 10/2010 |
| KR | 20010111667 | 12/2001 |
| KR | 2002-89078 | 11/2002 |
| MX | PA03005163 | 9/2003 |
| MX | PA04002568 | 12/2004 |
| MX | PA/a/2006/008026 | 7/2006 |
| WO | 2005/071958 | 8/2005 |

OTHER PUBLICATIONS

Mexican Office Action issued Jun. 12, 2009 in MX Application No. PA/a/2006/013046.

KR Office Action dated Aug. 11, 2006 issued in KR 2005-39317.

Office Action (issuance date: Jul. 22, 2011) issued by the Mexican Patent Office for Mexican Patent Application No. MX/a/2009/009052.

Office Action (issuance date: Jul. 22, 2011) issued by the Mexican Patent Office for Mexican Patent Application No. MX/a/2009/009053.

Office Action (issuance date: Jul. 22, 2011) issued by the Mexican Patent Office for Mexican Patent Application No. MX/a/2009/009051.

Office Action (issuance date: Jul. 20, 2011) issued by the Mexican Patent Office for Mexican Patent Application No. MX/a/2009/009056.

Canadian Office Action Issued on May 4, 2012 in CA Patent Application No. 2,565,284.

Communication dated Oct. 9, 2012 issued by the State Intellectual Property Office of P.R. China in counterpart Chinese Patent Application No. 200910168915.2.

* cited by examiner

United States Patent US 8,565,354 B2

DIGITAL BROADCASTING TRANSMISSION/RECEPTION DEVICES CAPABLE OF IMPROVING A RECEIVING PERFORMANCE AND SIGNAL PROCESSING METHOD THEREOF

This application is a divisional of prior application Ser. No. 11/587,924, filed Oct. 26, 2006, in the U.S. Patent and Trademark Office, now pending, which claims priority from Korean Patent Application Nos. 2004-33990, 2005-39309, and 2005-39317, filed on May 13, 2004, May 11, 2005 and May 11, 2005, respectively, in the Korean Intellectual Property Office, and International application PCT/KR05/01398, filed on May 12, 2005, the disclosure of which is incorporated herein in its entirety by reference.

TECHNICAL FIELD

The present invention relates to a digital broadcasting transmitter and receiver, and more specifically, to a digital broadcasting transmitter for replacing and transmitting stuff bytes inserted in data stream with predefined known data in a dual stream to enhance reception performance and a signal processing method thereof, and a corresponding digital broadcasting receiver and a signal processing method thereof.

BACKGROUND ART

The Advanced Television Systems Committee Vestigial Sideband (ATSC VSB), U.S-oriented terrestrial waves digital broadcasting system, is a single carrier scheme and uses field synchronizing signal by 312 segment unit. Accordingly, reception performance is not good in poor channels, especially in a doppler fading channel.

FIG. 1 is a block diagram showing a conventional transmitter of the ATSC VSB. The digital broadcasting transmitter of FIG. 1 forms and transmits a dual stream by adding a robust data to a normal data of the existing ATSC VSB system according to 'ATSC Digital Television Standard (A/53B)' of Enhanced Vestigial Sideband (FVBS) system.

As shown in FIG. 1, the robust data in the digital broadcasting transmitter is processed by a robust data processor (11), and the robust data processor (11) has a Reed-Solomon (RS) encoder (11-1), a data interleaver (11-2) and a packet formatter (11-3). The packet formatter (11-3) has a packet identifier (PID) inserter (not shown) and a ½ or ¼ rate duplicator (not shown). Robust data processed by the robust data processor (11) is multiplexed with a normal data by a multiplexer (MUX) (12).

The data output in the multiplexer (12) is randomized through a randomizer (13) and passes through an RS encoder (14) and an interleaver (15) in the form of a concatenated code to correct errors generated by the channel. In addition, a symbol processor (16) performs enhanced coding for the robust data, a deinterleaver (17) deinterleaves it before reconstructing RS parity, and an RS parity deleting part (18) deletes RS parity to be compatible with the existing system. The data whose the RS parity is deleted is input to a VSB transmitter (19). The VSB transmitter (19) includes an RS encoder (19-1), a data interleaver (19-2), a Trellis encoder (19-3) and a multiplexer (19-4) according to the structure of a general VSB transmitter and performs RS encoding, data interleaving, 12 Trellis interleaved encoding, insertion of a synchronizing signal and a pilot, VSB modulation and up-convertor.

The above-mentioned conventional digital broadcasting transmitter transmits normal data and robust data in one channel as a dual stream scheme. The robust data is pre-processed by the robust data processor, in detail the pre-processing is performed by the RS encoder (11-1), the interleaver (11-2) and the packet formatter (11-3) with the PID inserter (not shown) and the duplicator (not shown) so that the Moving Picture Experts Group-2 transport stream (MPEG-2 TS) is generated.

The robust data pre-processed by the robust data processor (11) is multiplexed with the normal data by the multiplexer (MUX) (12) and is randomized by the randomizer (13) and the randomized data is outer-coded by the RS encoder (14) of an outer coder, and the outer-coded data is dispersed by the interleaver (15). In addition, the robust data is enhancedly coded by the symbol processor (16), and passes through the deinterleaver (17) for performing symbol-to-byte conversion and data interleaving for compatibility with the existing system and the parity delete (18).

Later, as performed in the existing VSB transmitter, RS encoding, data interleaving, 12 Trellis interleaved encoding, insertion of a synchronizing signal and a pilot, VSB modulation and so on are carried out.

FIG. 2 shows a data format of the data output by the multiplexer (12). In FIG. 2, the normal data and the robust data are arranged at certain intervals so that the normal signal and the robust signal after Trellis encoding are distributed at regular intervals.

The U.S-oriented terrestrial waves digital television system of FIG. 1 transmits in the dual stream by adding the robust data in the normal data of the existing ATSC VSB system, so the existing normal data and the robust data are transmitted altogether.

However, the U.S-oriented terrestrial waves digital television system of FIG. 1 has a problem that in spite of dual stream transmission with the robust data, poor transmission performance at multipath channels on transmitting the existing normal stream is not almost improved.

DISCLOSURE OF INVENTION

Technical Problem

Therefore, an aspect of the present invention is to provide a digital broadcasting transmitter for replacing and transmitting stuff bytes inserted in dual stream with known data to enhance transmission performance and a signal processing method thereof and a corresponding digital broadcasting receiver and a signal processing method thereof.

Technical Solution

To achieve an aspect of the present invention, a digital broadcasting transmitter includes a robust data pre-processor for processing a robust data to generate a robust data packet of a predetermined format; a TS stream generator for inputting a normal data packet, including stuff bytes in a certain location, and inserting the robust data packet at certain intervals among the normal data packets so that a dual TS stream of a certain format is generated; a randomizer for randomizing the TS stream output from the TS stream generator; a stuff byte replacing part for replacing the stuff bytes of the data output from the randomizer with a predetermined known data; a first RS encoder for performing RS encoding of the data output from the stuff byte replacing part; an interleaver for interleaving the data output from the first RS encoder; a symbol processor for coding the robust data among the data output from the interleaver; a first deinterleaver for deinterleaving the data output from the symbol processor; and a Trellis encoder for initializing memory at the beginning point of the known data among the data output from the first interleaver and performing Trellis encoding.

Preferably, the known data has a predefined certain pattern.

Additionally, the digital broadcasting transmitter further includes a second deinterleaver for deinterleaving the data output from the synbol processor; and a parity delete for deleting an RS parity in the data output from the second deinterleaver.

Further, the digital broadcasting transmitter further includes a third RS encoder for performing RS encoding of the data output from the parity delete; and a reinterleaver for interleaving the data output from the third RS encoder.

More preferably, the digital broadcasting transmitter further includes a RS output buffer for inputting and temporarily storing the known data from the beginning point among the data output from the third RS encoder.

Further, the RS output buffer inputs and stores the known data altered according to initializing of memory from the Trellis encoder.

Additionally, the digital broadcasting transmitter further includes a parity restructuring part for generating the altered parity by inputting the altered known data from the RS output buffer and performing RS encoding, and outputting the altered parity to the Trellis encoder so as to replace the parity added by the third RS encoder.

Further, the stuff bytes are inserted in an adaptation field of the normal data packet.

Additionally, the normal data packet includes information on length of the inserted stuff bytes at a certain location.

Meanwhile, a method for signal processing for a digital broadcasting transmitter according to the present invention includes a robust data preprocessing step of processing the robust data to generate a robust data packet of a certain format; a TS stream generating step of being input with a normal data packet where stuff bytes are inserted at a certain location and inserting the robust data packet at certain intervals in the normal data packet to generate a dual TS stream of a predetermined format; a randomizing step of randomizing the TS stream generated in the TS stream generating step; a stuff byte replacing step of replacing the stuff bytes in the data output from the randomizing step with a predetermined known data; a first RS encoding step of performing RS encoding of the data output from the stuff byte replacing step; an interleaving step of interleaving the data output from the first RS encoding step; a symbol processing step of coding the robust data of the data output from the interleaving step; a first deinterleaving step of deinterleaving the data output from the symbol processing step; and a Trellis encoding step of initializing memory at the beginning point of the known data of the data output from the first deinterleaving step and performing Trellis encoding.

Additionally, A digital broadcasting transmitter according to another embodiment includes a TS stream generator for receiving a normal data packet and a robust data packet respectively having stuff bytes at a certain location and inserting the robust data packet at certain intervals among the normal data packet to generate dual TS stream of a certain format; a randomizer for randomizing the TS stream output from the TS stream generator; a stuff byte replacing part for replacing the stuff bytes of the data output in the randomizer with a predetermined known data; a first RS encoder for performing RS encoding of the data output from the stuff byte replacing part; an interleaver for interleaving the data output in the first RS encoder; a symbol processor for performing coding of the robust data of the data output in the interleaver; a first deinterleaver for deinterleaving the data output in the symbol processor; and a Trellis encoder for initializing memory of the known data of the data output in the deinterleaver at the beginning point, and performing Trellis encoding.

Preferably, the stuff bytes are inserted in adaptation field of the normal data packet and the robust data packet.

Further, the normal data packet and the robust data packet include information on length of the inserted stuff bytes at a certain location.

Additionally, a method for signal processing for a digital broadcasting transmitter includes a TS stream generating step of receiving normal data packet and robust data packet respectively having stuff bytes at a certain location and inserting the robust data packet among the normal data packet at certain intervals to generate dual TS stream of a certain format; a randomizing step of randomizing the TS stream generated in the TS stream generating step; a stuff byte replacing step of replacing the stuff bytes of data output in the randomizing step with a predetermined known data; a first RS encoding step of performing the RS encoding of data output in the stuff byte replacing step; an interleaving step of interleaving data output in the first RS encoding step; a symbol processing step of performing coding the robust data of data output in the interleaving step; a first deinterleaving step of deinterleaving data output in the symbol processing step; and a Trellis encoding step of initializing memory of the known data of data output in the first deinterleaving step at the beginning point and performing Trellis encoding.

Meanwhile, a digital broadcasting receiver according to the present invention includes a demodulator for receiving and demodulating signal encoded by inserting a predetermined known data in a certain location of dual stream, where stuff bytes are inserted in the certain location, from the digital broadcasting receiver; a known data output part for detecting a location of the known data from the demodulated signal and outputting the known data; an equalizer for equalizing the demodulated signal; a Viterbi decoder for correcting errors of the equalized signal and decoding using the detected known data; a deinterleaver for deinterleaving data output in the Viterbi decoder; a derandomizer for derandomizing data output in the deinterleaver; a de-multiplexer for separating robust data and normal data in data output in the derandomizer; and a robust data processor for processing and restructuring the robust data.

Preferably, the known data output part includes a known symbol detector for detecting information on the certain location where the known data is inserted in received signal; a segment flag generator for generating data frame including one or more segment indicating the location with a predetermined identification flag; a Trellis interleaver for encoding the data frame as encoding in the digital broadcasting transmitter; and a known data extractor for inserting and outputting the known data at the location where the identification flag is indicated in the interleaved data frame.

Further, the known data output part outputs the detected known data to the demodulator, and the demodulator performs demodulation using the known data.

Additionally, a method for signal processing for a digital broadcasting receiver according to the present invention includes a demodulating step of receiving and demodulating encoded signal by inserting a predetermined known data in a certain location of dual stream, where stuff bytes are inserted in the certain location, from a digital broadcasting transmitter; a known data outputting step of detecting a location of the known data from the demodutated signal and outputting the known data; a equalizing step of equalizing the demodulated signal; a decoding step of correcting errors of the modulated signal using the detected known data and decoding; a deinterleaving step of deinterleaving data output in the decoding step; a derandomizing step of derandomizing data output in the deinterleaving step; a demultiplexing step of separating robust data and normal data from data output in the derandomizing step; and a robust data processing step of processing and restructuring the robust data.

Advantageous Effects

According to the present invention, a digital broadcasting transmitter generates and inserts stuff bytes in a MPEG-2 TS packet, the inserted stuff bytes are replaced with known data and transmitted to a digital broadcasting receiver, and a digital broadcasting receiver detects and uses the known data. Accordingly, there are effects of compatibility with the existing digital broadcasting system, lower complexity of hardware, and enhanced digital broadcasting reception performance in poor multipath channels.

BEST MODE FOR CARRYING OUT THE INVENTION

Hereinafter, the present invention will be described in detail with reference to the accompanying drawings.

Figure 5:
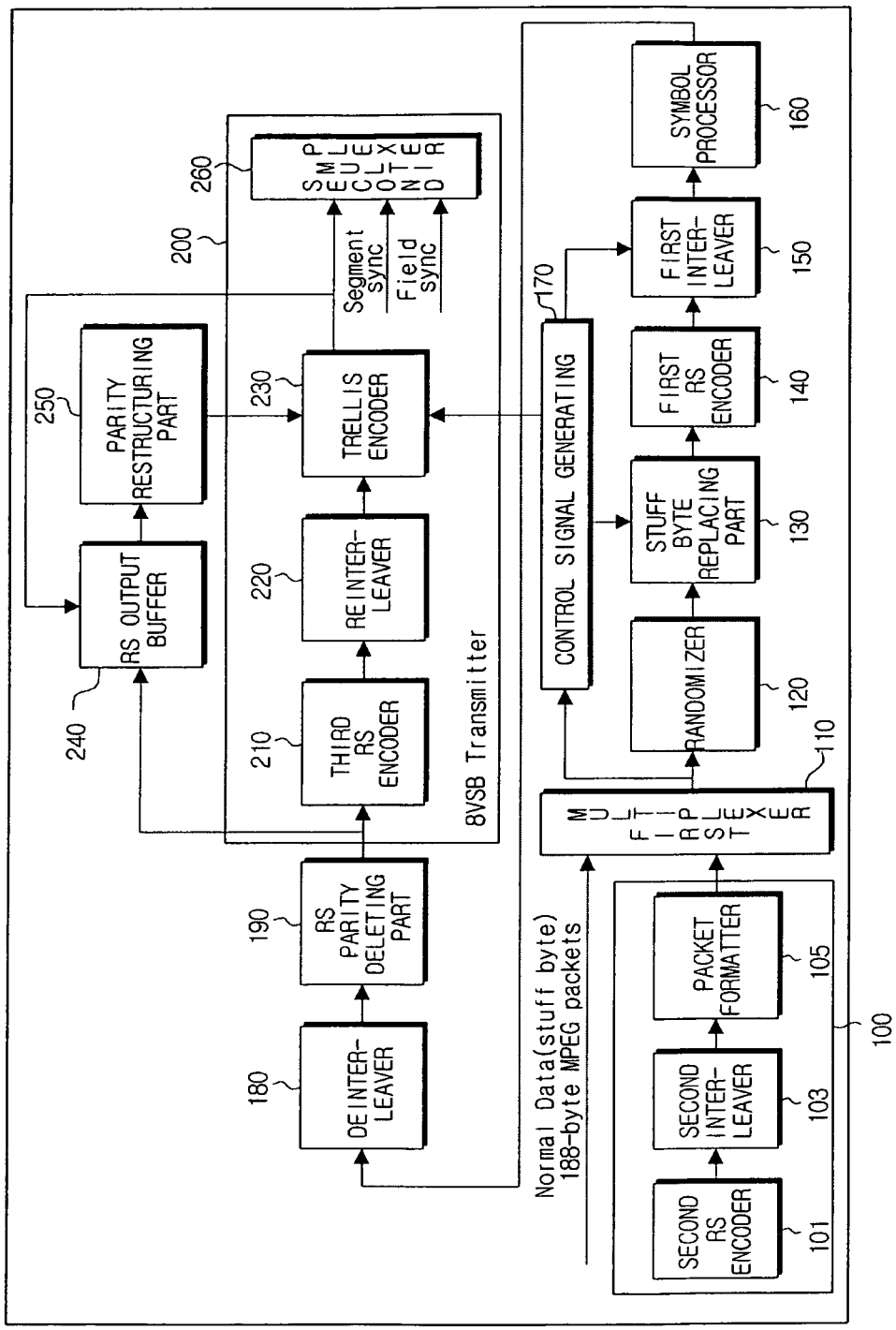
FIG. 5 is a block diagram of a digital broadcasting transmitter according to the present invention.

FIG. 5 is a block diagram of a digital broadcasting transmitter according to the present invention. The digital broadcasting transmitter of FIG. 5 has the structure to improve the EVSB system that LG (Zenith)/ATI proposed. In detail, stuff bytes are added in a MPEG-2 packet of normal data, the added stuff bytes are replaced with known data in the digital broadcasting transmitter, and then are transmitted. Then, the known data is detected in a corresponding digital broadcasting receiver and is used to compensate distortion by a channel.

In FIG. 5, the digital broadcasting transmitter has a first multiplexer (110) for multiplexing normal data and robust data output from a robust data pre-processor (100), a randomizer (120) for randomizing the multiplexed data, a stuff byte replacing part (130) for replacing the stuff bytes, inserted in the normal data or robust data of the randomized data, with a particular sequence, a first RS encoder (140) for constructing the data output from the stuff byte replacing part (130) in the form of concatenated code to correct errors by a channel, a first interleaver (150) for interleaving data, a symbol processor (150) a symbol processor (160) for enhancedly coding the robust data in the interleaved data, a control signal generator (170), de-interleaver (180) for de-interleaving the enhancedly coded data to be comparable with the existing system and a RS parity deleting part (190) for deleting an RS parity. The digital broadcasting transmitter employs the EVSB system and is constructed to be compatible with the existing system.

In addition, the digital broadcasting transmitter of FIG. 5 has a third RS encoder (210) for carrying out a VSB transmitting channel coding, a reinterleaver (220) for interleaving data again, and a Trellis encoder (230) for performing ⅔ rate Trellis encoding. The Trellis encoder (230) carries out the process to initialize the stuff bytes.

The robust data pre-processor (100) has a second RS encoder (101) for performing RS-encoding of a robust stream, a second interleaver (103) for interleaving the RS-encoded robust stream, and a packet formatter (305) for formatting the interleaved robust stream in a certain format.

That is, the robust data pre-processor (100) inserts PID in the RS-encoded robust stream through the packet formatter (305) and doubly duplicates it. Then, the robust data pre-processor (100) outputs robust MPEG packets as formatted to insert among the normal MPEG packets at certain intervals.

Figure 3:
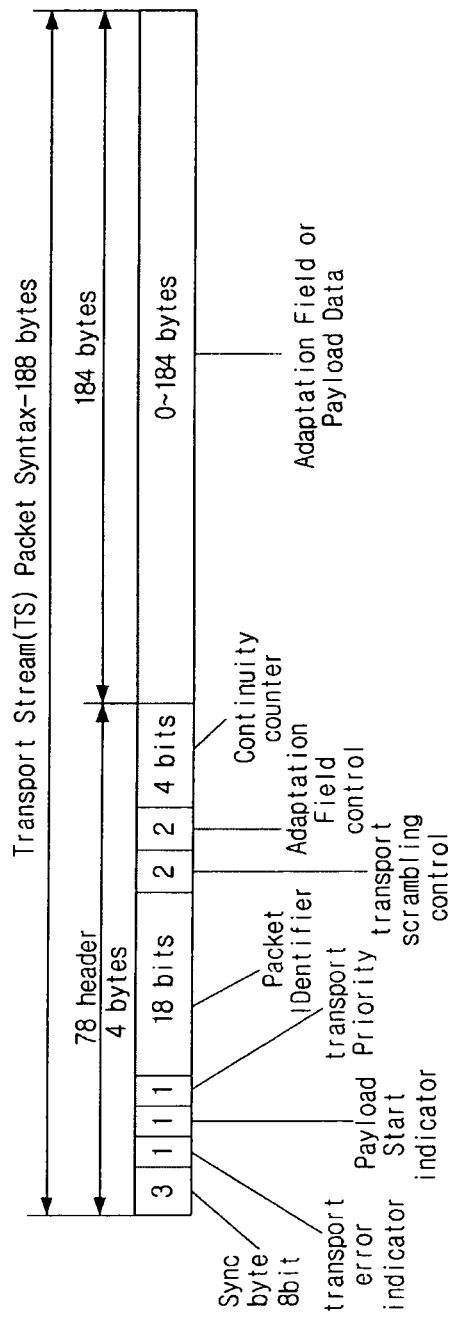
FIG. 3 is a view showing a frame structure of a TS packet.
Figure 4:
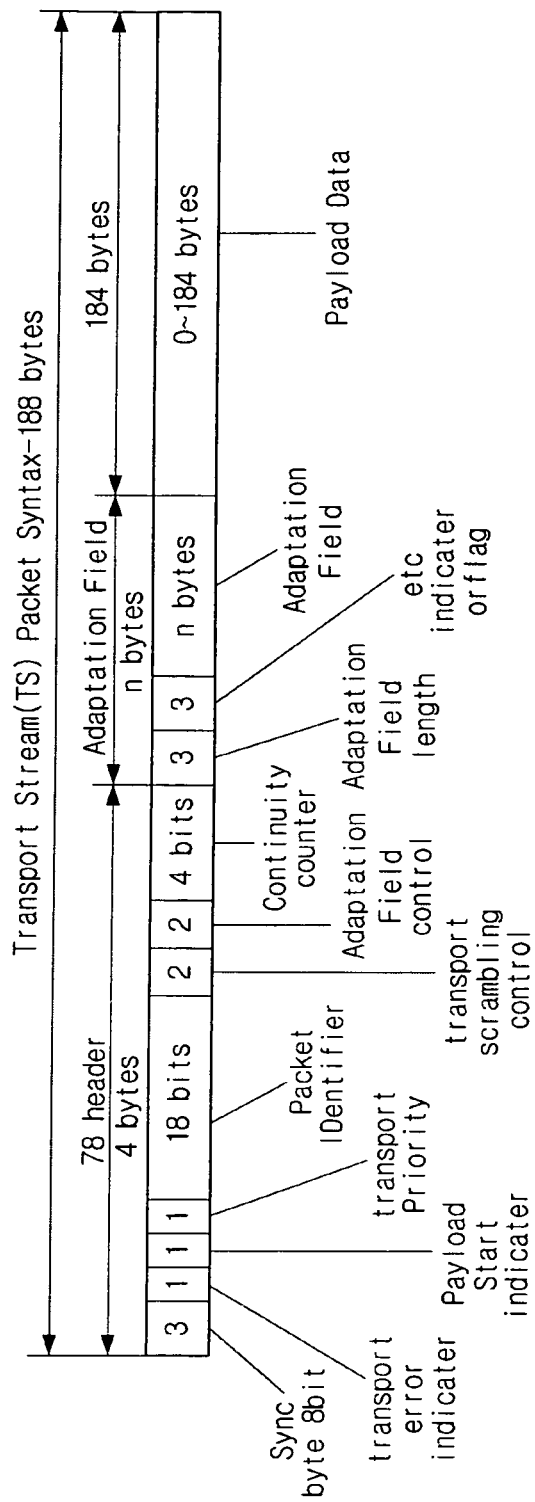
FIG. 4 is a view showing a frame structure of a TS packet including stuff bytes according to the present invention.

Meanwhile, the normal data packets or robust data packets to be input to the first multiplexer (110) according to the present invention include the stuff bytes. FIG. 3 is a view showing a frame structure of a general TS stream packet. FIG. 4 is a view showing a frame structure of a MPEG-2 TS stream packet including adaptation field with stuff bytes according to the present invention.

In FIG. 4, a MPEG-2 packet of 188 bytes consists of information signal (MPEG-2 header) of 4 bytes including MPEG synchronizing signal, adaptation field length information of 1 byte, other information of 1 byte, adaptation field data with stuff bytes of n bytes, and ES data of '188−(4+2+n)' bytes.

As shown in FIG. 3, a general TS stream packet frame consists of the MPEG-2 header and the adaptation field or the ES data. The normal data packet or robust data packet according to the present invention, as shown in FIG. 4, has structure that stuff bytes are inserted in the adaptation field so that TS stream includes the adaptation field. Such MPEG-2 TS packet of the normal data or robust data is input to the first multiplexer (110).

The first multiplexer (110) multiplexes the above-mentioned normal data or robust data output from the robust data pre-processor (100), and the randomizer (120) randomizes the multiplexed data.

The stuff byte replacing part (130) replaces stuff bytes, inserted in the normal data or robust data of the randomized data, with, for example, a particular sequence generated by a particular sequence generator (not shown) to output them. The particular sequence is data having predefined pattern that the transmitter and the receiver have already known each other, which is hereinafter referred to as known data.

Figure 6:
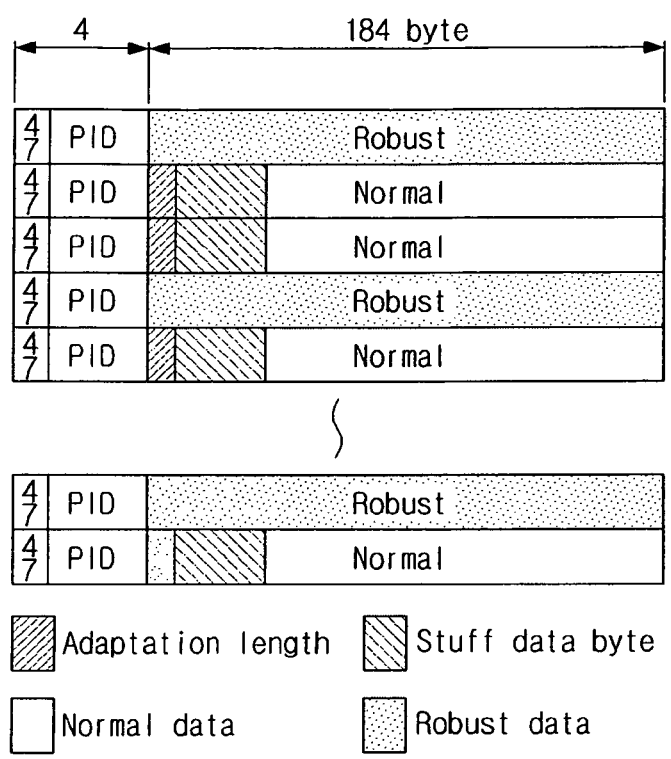
FIG. 6 and FIG. 7 are views showing a format of data output from a randomizer of FIG. 5, FIG. 8 and FIG. 9 are views showing a format of data output from an interleaver of FIG. 5, FIG. 10 and FIG. 11 are views showing a format of data output from a Trellis encoder of FIG. 5, FIG. 12 and FIG. 13 are views showing a format of data which parity is restructured according to Trellis initialization of FIG. 5.

FIG. 6 shows a data format after replacing stuff bytes of n bytes in a normal data packet with the particular sequence data in outputting from the randomizer (120). In FIG. 6, normal data packets and robust data packets are arranged at certain intervals and known data instead of stuff bytes are inserted in the adaptation fields of the normal data packets.

Figure 7:
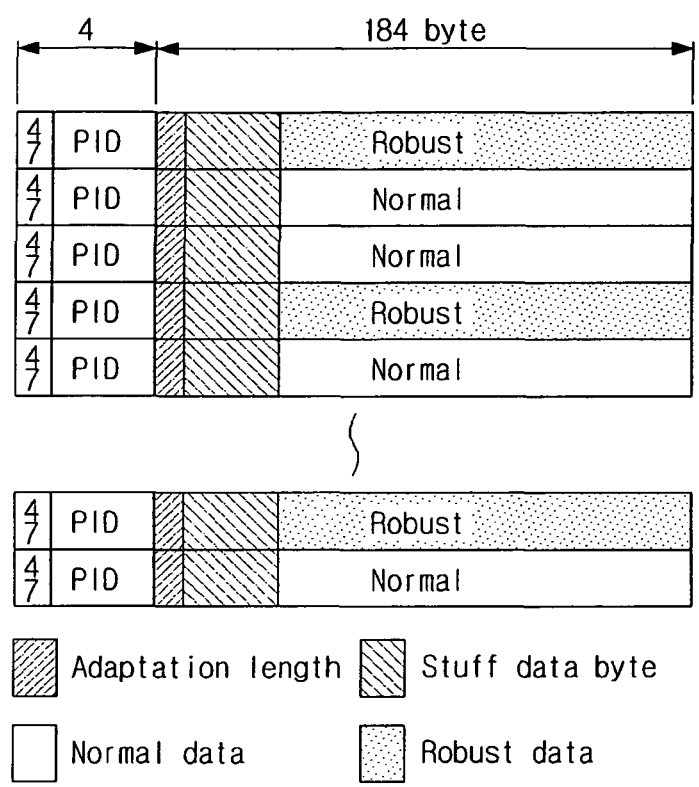

Further, FIG. 7, when stuff bytes are inserted in normal data packets and robust data packets, respectively, to be input to the randomizer (1120), shows a data format after replacing stuff bytes of n bytes in normal data packets and robust data packets with the particular sequence data in outputting from the randomizer (120). In FIG. 7, normal data packets and robust data packets are arranged at certain intervals and known data instead of stuff bytes are inserted in the adaptation fields of the normal data packets and robust data packets.

In addition, as described above, the header of MPEG-2 packet data output from the randomizer (120) includes the first byte of a synchronizing signal and 3 bytes of packet identity (PID). The first 2 bytes of adaptation field of certain bytes include adaptation field length information. In other words, the first 2 bytes of the adaptation field have information on length of stuff bytes inserted in the adaptation field, that is, length of known data. As the beginning location of the known data in a packet is fixed, the receiver can know the information on location and length, that is, quantity of the known data according to the information inserted in the first 2 bytes of the adaptation field.

The first RS encoder (140) encodes the data output from the stuff byte replacing part (130), and performs outer coding in the form of concatenated code to correct errors generated by a channel.

The first interleaver (150) interleaves the data output from the first RS encoder (140). The symbol processor (160) performs enhanced coding of the robust data in the interleaved data. To be compatible with the existing system, the de-interleaver (180) deinterleaves and the RS parity deleting part (190) deletes parity in enhanced-coded data.

Figure 8:
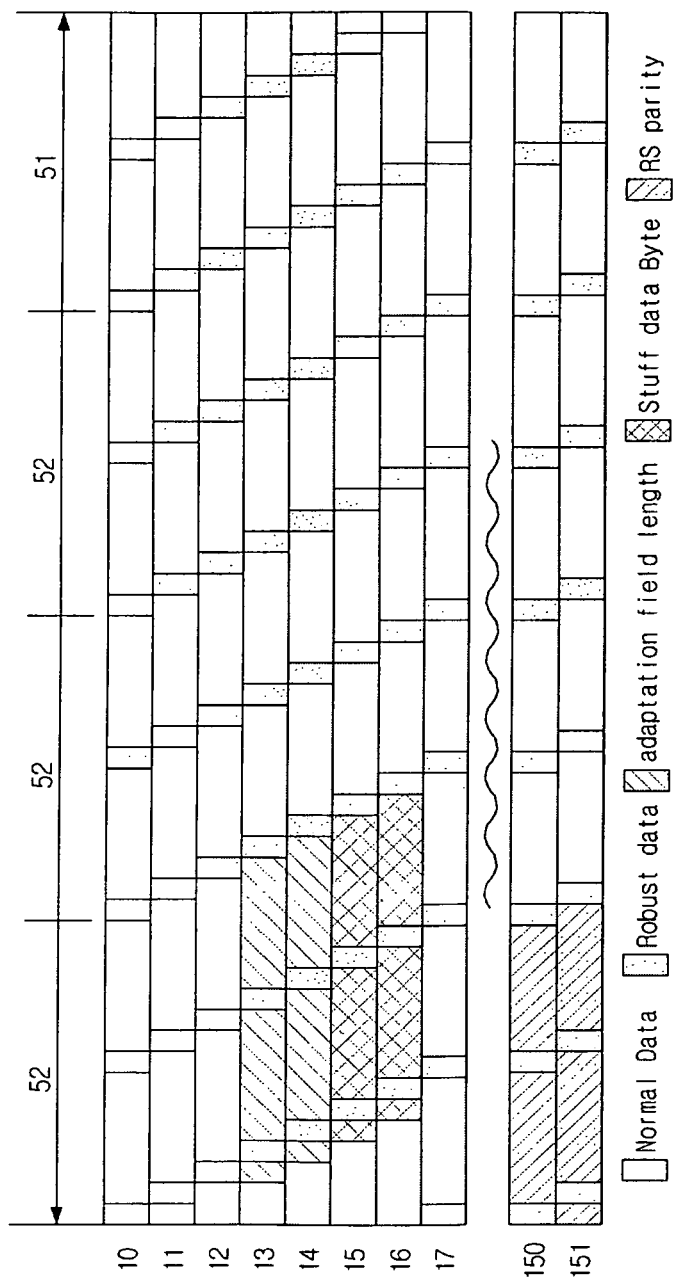
Figure 9:
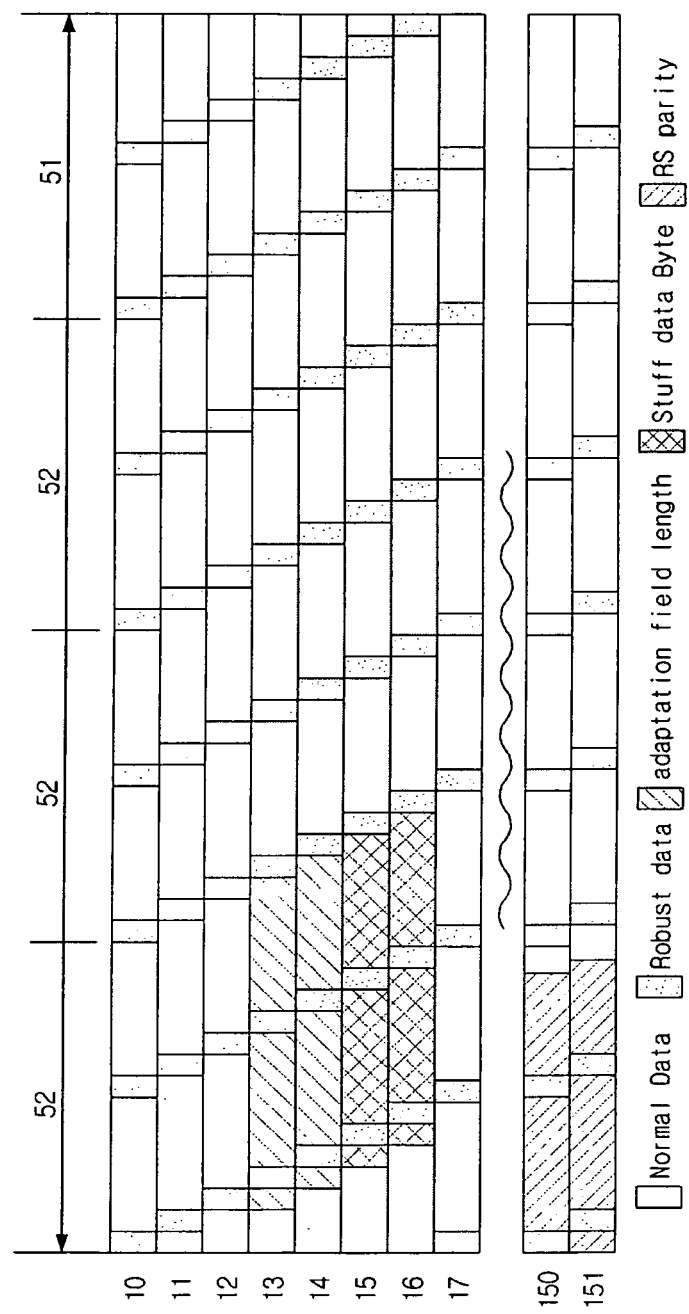
Figure 10:
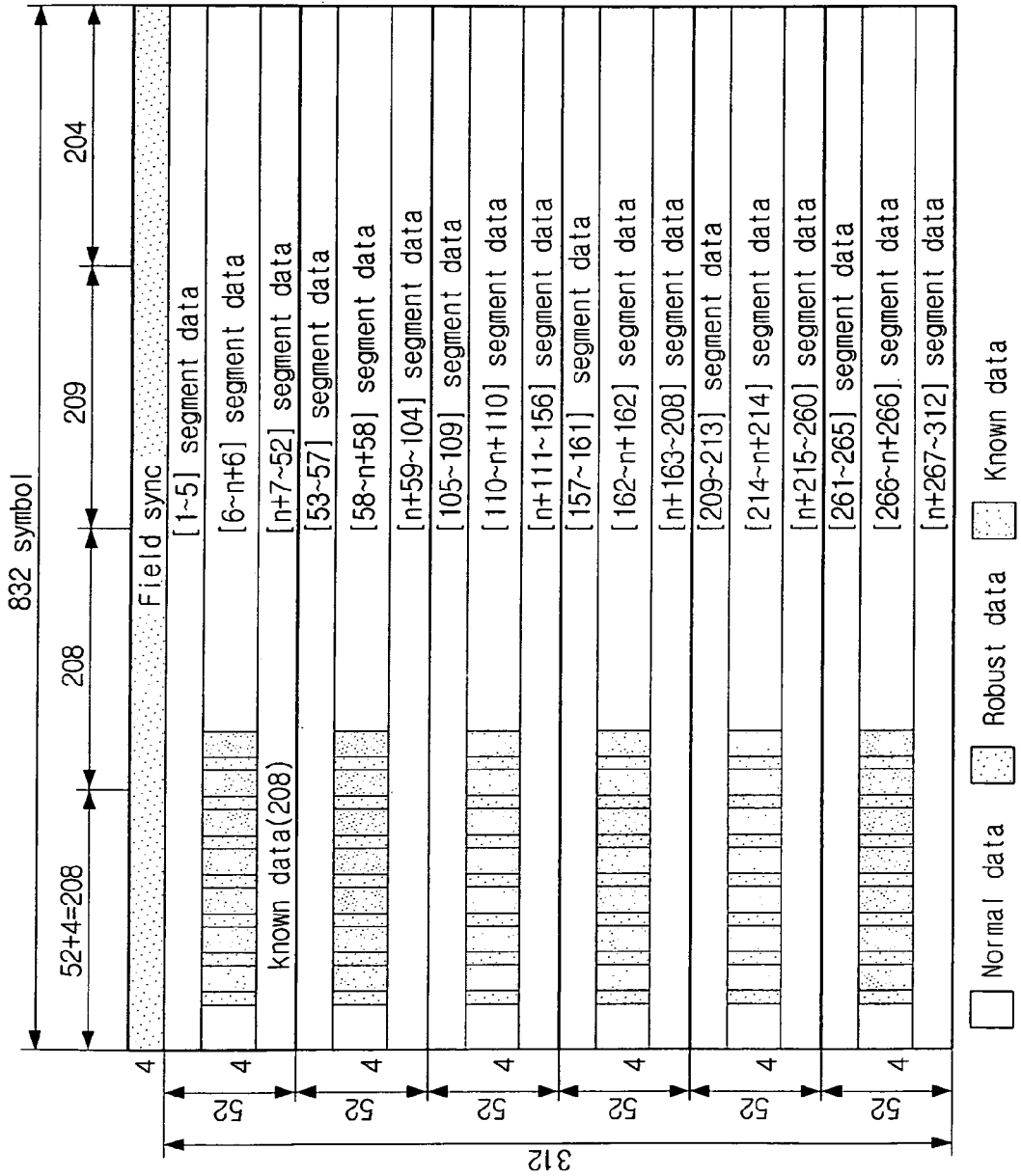
Figure 11:
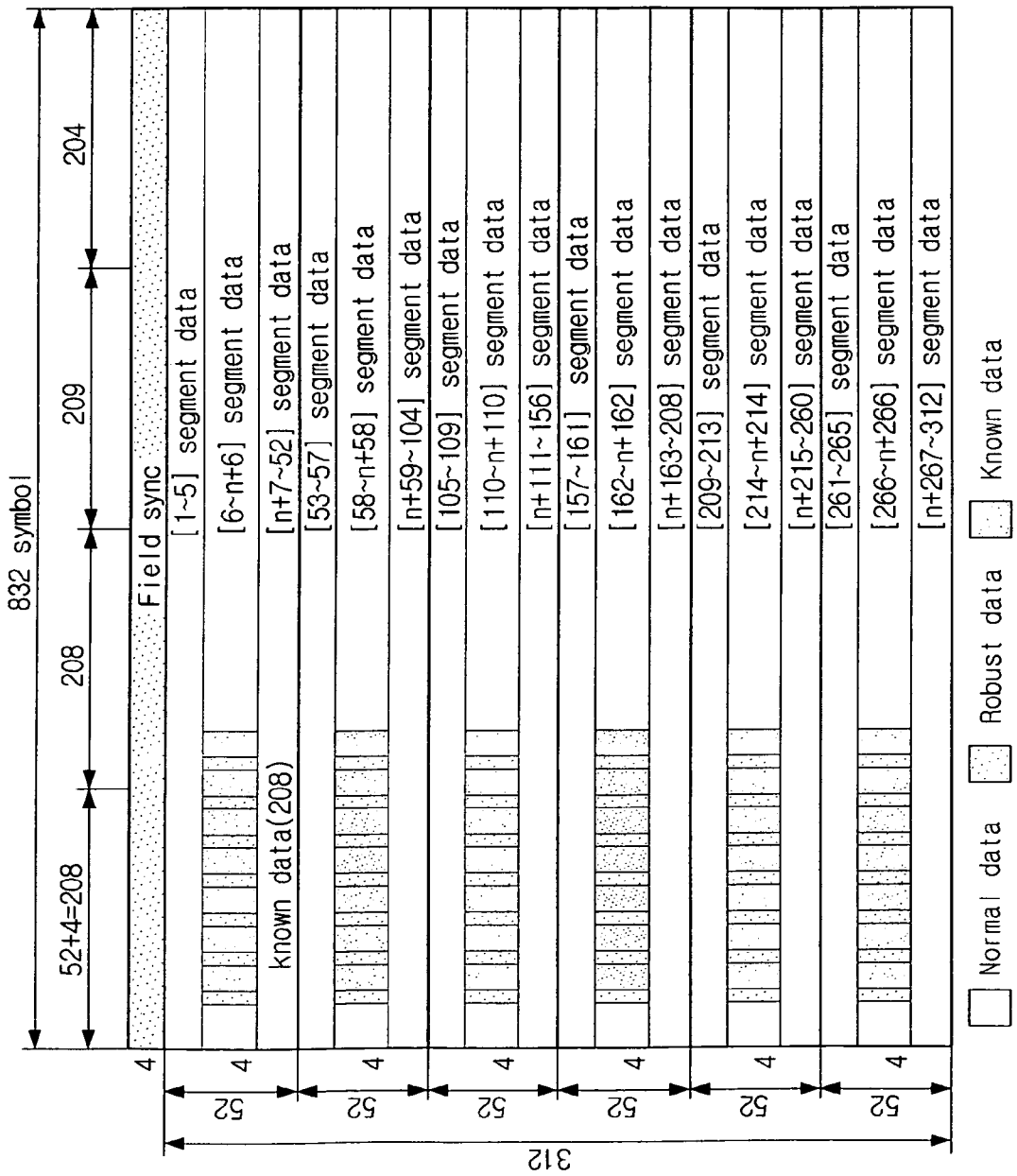

FIG. 8 and FIG. 9 show a data format after interleaving data by the first interleaver (150). MPEG-2 packets of FIG. 6 and FIG. 7 are dispersed in 52 units by the first interleaver (150), as those in FIG. 8 and FIG. 9. Data with the same byte location in MPEG-2 packet construct the same column, as shown FIG. 8 after interleaving. In addition, the data format output from the Trellis encoder (230) after 12 symbol interleaving is shown in FIG. 10 and FIG. 11. That is, data located in the same byte of MPEG-2 packets construct almost one data segment, as shown in FIG. 10 and FIG. 11, after Trellis encoding. Therefore, if stuff bytes are consecutively added in certain location of MPEG-2 packet and randomized, and the stuff bytes are replaced with a particular sequence, with Trellis encoding, the stuff bytes inserted in the same byte location form one data segment, which is detected and used in the digital broadcasting receiver as the known data to improve reception performance.

The control signal generator (170) detects information on the adaptation field length, and generates and outputs flag signal indicating a location of stuff bytes or known symbol sequence data.

Furthermore, to perform a VSB transmitting channel coding, the third RS encoder (210) performs RS encoding, the reinterleaver (220) interleaves data again, and the Trellis encoder (230) performs ⅔ rate Trellis encoding.

An RS output buffer (240) and a parity restructuring part (250) restructure parity of the known data which is altered according to the initialization of the Trellis encoder (230) and perform the VSB transmitting channel coding with the Trellis encoder (230).

The RS output buffer (240) outputs the known data from the data without RS parity which is output from the RS parity deleting part (190) from the beginning, and temporarily stores the output known data. Then, when the known data is Trellis-encoded in the Trellis encoder (230) according to the initialization, the RS output buffer (240) receives the known data altered according to the initialization from the Trellis encoder (230), replaces the previously buffered known data with it and stores the altered known data, and inputs the altered known data to the parity restructuring part (250) to regenerate parity.

The parity restructuring part (250) receives the known data altered according to the initialization, regenerates parity according to the altered data, and inputs it to the trellis encoder (230) so that the previous parity is replaced with the new parity.

The Trellis encoder (230) converts the data output from the reinterleaver (220) into symbol and performs symbol mapping through ⅔ rate Trellis encoding. Furthermore, as above-mentioned, the Trellis encoder (230) performs 12 Trellis encoder initialization at beginning location of the known data, that is, known symbol sequence so that value of memory element of the encoder becomes a particular value, for example, '00'. The Trellis encoder (230) initializes a value temporarily stored in memory element itself at beginning location of the known data and carries out Trellis encoding of the known data.

Therefore, the data packet output from the Trellis encoder (230) to a multiplexer (260) includes the known data altered according to the memory element initialization of the Trellis encoder (230), and has data format added with parity according to RS encoding of the altered known data.

FIG. 10 and FIG. 11 show data formats output from the Trellis encoder (230), which are processed with 12 symbol interleaving. One field includes six convolutional interleavers so that six sequences including stuff bytes appear. In other words, if TS stream has stuff bytes of 10 bytes, known symbol sequences of '10×6=60' are generated in one field.

Figure 12:
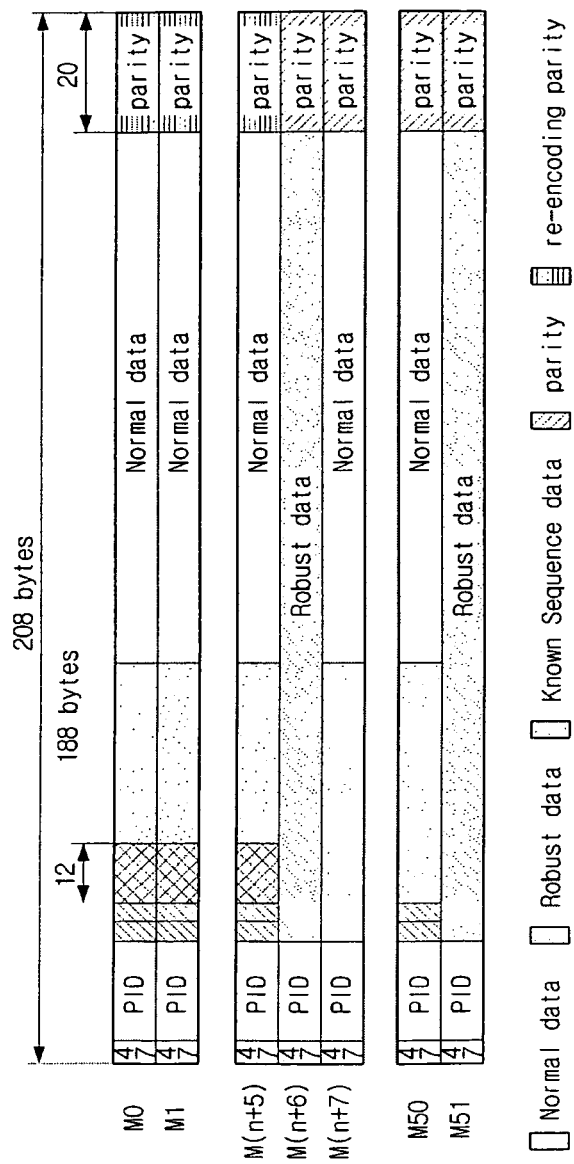
Figure 13:
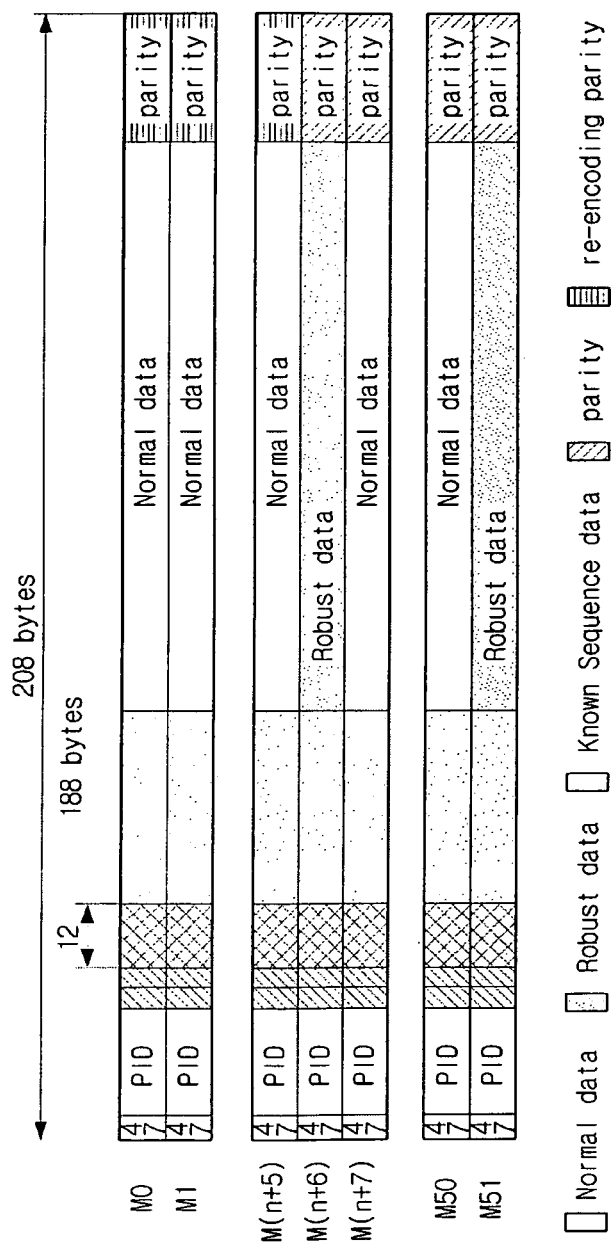

FIG. 12 and FIG. 13 show a data format after RS re-encoding and parity restructuring by the parity restructuring part (250) of FIG. 5. That is, if the Trellis encoder (230) is initialized at beginning point of sequence of known symbol, the parity restructuring part (250) alters output parity of the third RS encoder (210) according to the value of initialization and the altered parity is input to the Trellis encoder (230). Accordingly, the Trellis encoder (230) updates the altered parity and carries out the Trellis encoding so that there will be no problem when an RS decoder of the digital broadcasting receiver decodes.

In other words, initialization of the Trellis encoder (230) is performed in order for Trellis encoded data to form particular sequence during known symbol sequence section. Then, in order to alter RS parity corresponding to known symbol sequence altered according to the initialization, RS encoding of the altered known symbol sequence is performed again so that parity is altered. The existing parity is replaced with the altered parity so that the data format like FIG. 12 and FIG. 13 is generated.

Figure 1:
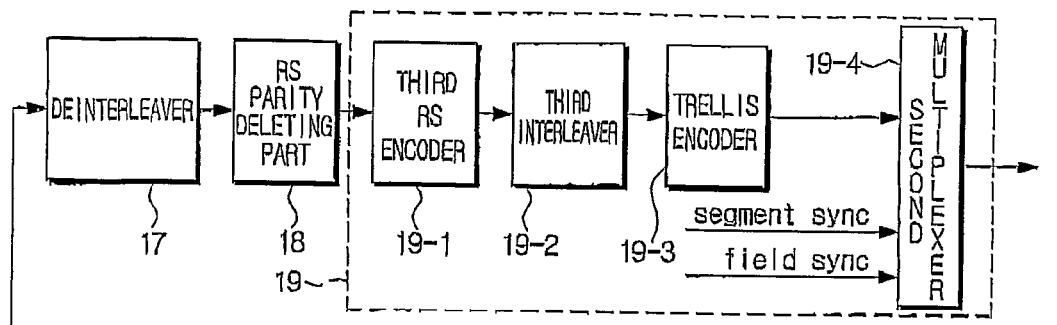
FIG. 1 is a block diagram of a transmitter of a conventional U.S-oriented terrestrial waves digital broadcasting (ATSC VSB) system.
Figure 2:
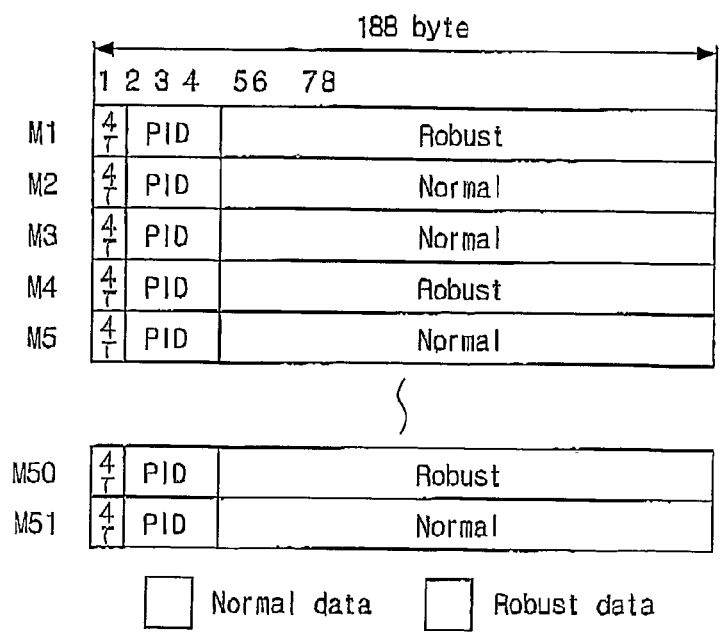
FIG. 2 is a view showing a format of ATSC VSB data.

To the data which is encoded via the Trellis encoder (230), the RS output buffer (240) and the parity restructuring part (250), and mapped into symbol, field sync signal and segment sync signal are inserted by the second multiplexer (260) like the data format of FIG. 2. DC offset is added in a transmitter end to generate pilot so that VSB modulation is performed, and the data is converted into RF and transmitted.

Figure 14:
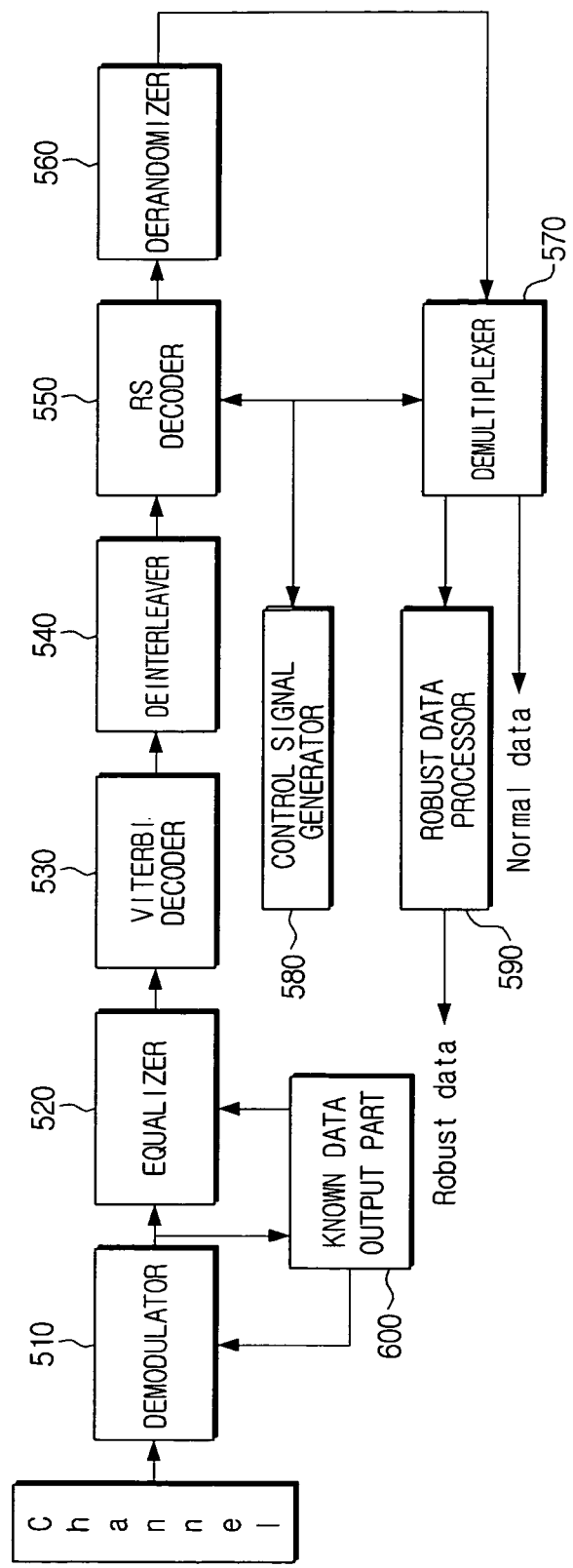
FIG. 14 is a block diagram of a digital broadcasting transmitter according to the present invention.

FIG. 14 is a block diagram of a digital broadcasting receiver corresponding to the digital broadcasting transmitter of FIG. 5 according to the present invention. If the received signal includes normal robust and stuff bytes, the digital broadcasting receiver has elements for decoding.

The digital broadcasting receiver of FIG. 14 includes a demodulator (510) for lowering RF signal to baseband and demodulating it, an equalizer (520) for deleting inter-symbol interference, a Viterbi decoder or Trellis decoder (530), a deinterleaver (540), an RS encoder (550), an derandomizer (560), a demultiplexer (570) for separating normal data and robust data, a control signal generator (580) for generating control signal to control dual stream, a robust data processor (590), and a known data output part (600) for detecting location of stuff bytes and outputting known data.

The Viterbi decoder (530), the deinterleaver (540), the RS encoder (550), and the inverse randomizer (560) correct error from the equalized signal and perform decoding.

The demodulator (510) converts RF signal received via channel into baseband signal through tuner/IF (not shown), detects sync of the converted baseband signal and performs demodulation. The equalizer (520) compensates multipath channel distortion of the demodulated signal.

Meanwhile, the known data output part (600) detects information on stuff byte length inserted in the reserved part of field sync data segment section or the first 2 bytes of adaptation field to acquire location information on known symbol, and outputs known data from the acquired information on location.

Figure 15:
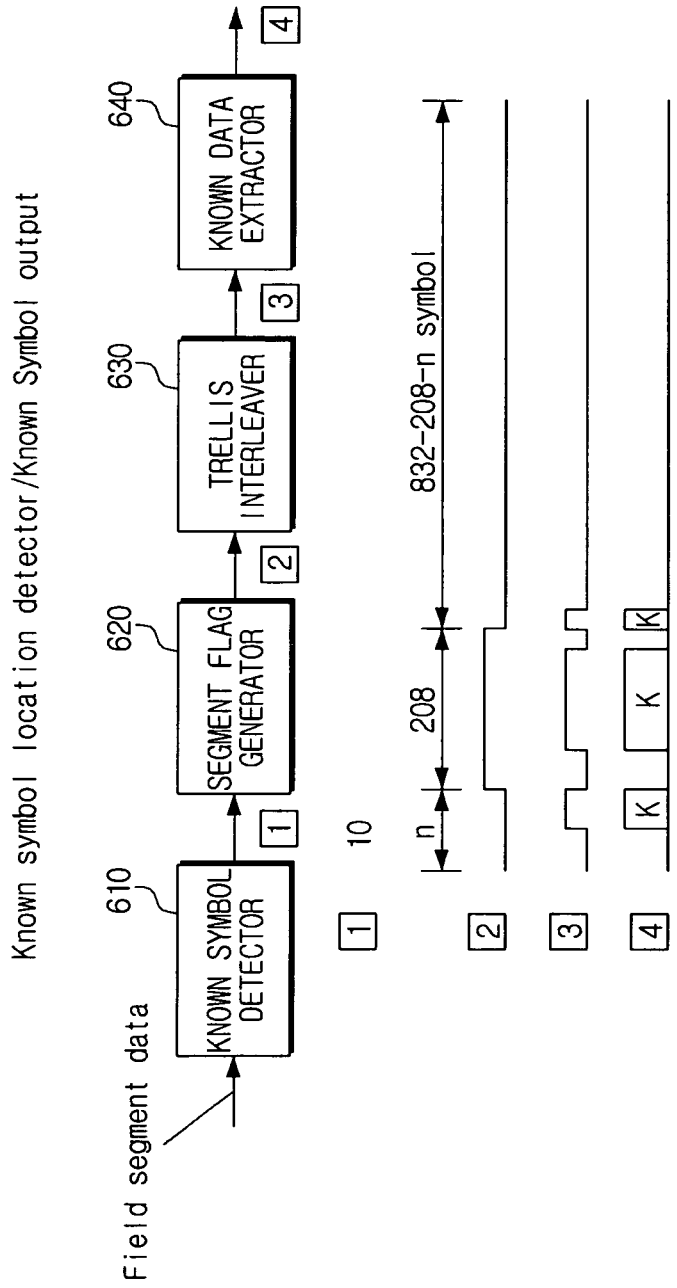
FIG. 15 is a view provided to describe a known data output part of FIG. 10.

FIG. 15 shows the known data output part (600) for detecting the known data in the digital broadcasting receiver.

The known data output part (600) includes a known symbol detector (610), a segment flag generator (620), a Trellis interleaver (630), and a known data extractor (640).

If the information on the quantity (the number) of stuff bytes is inserted in control information bit, including information on adaptation field length of data header, or in the reserved part of field sync data segment section, the known symbol detector (610) of the known data output part (600) of the digital broadcasting receiver detects the information on the quantity of known data. According to the detected information, the segment flag generator (620) and the Trellis interleaver (630) acquire information on the location and the number of known symbol. From the acquired information on the location and the number of known, the known data extractor (640) outputs the known data so that receiving performance of the digital broadcasting receiver is improved. As the location of stuff bytes is fixed all the time, if quantity of stuff bytes is detected, the segment flag generator (620) and the Trellis interleaver (630) can be implemented using a counter and a control logic.

That is, the known symbol detector (610) extracts information of known data location from control information bit including information on adaptation field length of the demodulated data header. The information on known data location includes the information on known data length. As the known data location is preset, the location and number of known symbols according to encoding of known data can be acquired by knowing the length.

According to the location and number of the known symbol, the segment flag generator (620) marks a predetermined flag of length corresponding to the number at the corresponding location and generates at least one segment and a MPEG-2 transmission frame including the segment.

The Trellis interleaver (630) encodes transmission frame generated in the segment flag generator (620) like interleaving in the digital broadcasting transmitter.

The known data extractor (640) inserts predefined known data at the location for known symbol which is identified by the flag in transmission frame encoded and output from the Trellis interleaver (630), and outputs the known data-inserted frame.

Meanwhile, errors of signal equalized by the equalizer (520) are corrected through the Viterbi decoder (530) and the signal is decoded to symbol data. The deinterleaver (540) rearranges data dispersed by the first interleaver (150) of the transmitter in FIG. 5. Errors of the deinterleaved data are corrected through the RS encoder (550). The control signal generator (580) generates control signal to process normal data and robust data. The corrected data through the RS encoder (550) is derandomized through the derandomizer (560). The derandomized data separates into normal data and robust data through the demultiplexer (570) and the robust data is processed by the robust data processor (590).

As above described, stuff bytes are generated and inserted in MPEG-2 TS packet, the inserted stuff bytes are replaced with known data and transmitted from the digital broadcasting transmitter, and then the digital broadcasting receiver detects and use the known data. Accordingly, receiving performance of the digital broadcasting receiver such as sync acquiring and equalizing performance can be improved.

The invention claimed is:

1. A digital broadcasting receiver, comprising:
a receiver to receive input data comprising normal data, supplementary data, a field sync and a segment sync, the supplementary data comprising known data which is different from the field sync and the segment sync and is a predefined pattern already known between a digital broadcasting transmitter and the digital broadcasting receiver;
a demodulator to demodulate the input data;
a known data detector to detect a location of the known data from the demodulated data; and
an equalizer to equalize the demodulated data using the known data,
wherein the supplementary data comprising the known data is deinterleaved at the digital broadcasting transmitter and is trellis-encoded at a trellis encoder of the digital broadcasting transmitter such that internal memories of the trellis encoder are initialized at a beginning point of the known data,
wherein the supplementary data is processed at the digital broadcasting transmitter to be more robust against error than the normal data, and
wherein the input data is first RS-encoded to add a parity and is second RS-encoded to regenerate a parity according to data altered by the initialization of the internal memories so that the parity is replaced with the regenerated parity.

2. The digital broadcasting receiver as claimed in claim 1, wherein the known data are included in a predetermined position of the supplementary data according to control information to control an insertion process of the known data.

3. The digital broadcasting receiver as claimed in claim 1, wherein the supplementary data is processed at the digital broadcasting transmitter such that packet identification (PID) is inserted into the supplementary data.

4. The digital broadcasting receiver as claimed in claim 1, wherein the supplementary data is processed at the digital broadcasting transmitter such that the supplementary data are duplicated.

5. The digital broadcasting receiver as claimed in claim 1, wherein the supplementary data is processed at the digital broadcasting transmitter such that the supplementary data is inserted between normal data.

6. The digital broadcasting receiver as claimed in claim 1, wherein the supplementary data is Reed-Solomon (RS) encoded and interleaved without the known data and the normal data, is deinterleaved with the known data, and is RS encoded and interleaved along with the known data and the normal data, at the digital broadcasting transmitter.

7. The digital broadcasting receiver as claimed in claim 1, further comprising:
a de-multiplexer for separating the input data into the normal data and the supplementary data; and
a robust data processor for processing the separated supplementary data.

8. The digital broadcasting receiver as claimed in claim 1, wherein the known data detector outputs a signal related to a location of the known data in the input data to the demodulator and the equalizer so that the demodulator and the equalizer use the known data for the demodulating and the equalizing based on the output signal.

9. The digital broadcasting receiver of claim 1, wherein the internal memories of the trellis encoder are set to predetermined values by the initialization.

10. A method for processing input data of the digital broadcasting receiver, the method comprising:
- receiving the input data comprising normal data, supplementary data, a field sync and a segment sync, the supplementary data comprising known data which is different from the field sync and the segment sync and is a predefined pattern already known between a digital broadcasting transmitter and the digital broadcasting receiver;
- demodulating the input data;
- detecting location of the known data stream from the demodulated data; and
- equalizing the demodulated data using the known data,
- wherein the supplementary data comprising the known data is deinterleaved at the digital broadcasting transmitter and is trellis-encoded at a trellis encoder of the digital broadcasting transmitter such that internal memories of the trellis encoder are initialized at a beginning point of the known data,
- wherein the supplementary data is processed at the digital broadcasting transmitter to be more robust against error than the normal data, and
- wherein the input data is first RS-encoded to add a parity and is second RS-encoded to regenerate a parity according to data altered by the initialization of the internal memories so that the parity is replaced with the regenerated parity.

11. The method as claimed in claim 10, wherein the known data are included in a predetermined position of the supplementary data according to control information to control an insertion process of the known data.

12. The method as claimed in claim 10, wherein the supplementary data is processed at the digital broadcasting transmitter such that packet identification (PID) is inserted into the supplementary data.

13. The method as claimed in claim 10, wherein the supplementary data is processed at the digital broadcasting transmitter such that the supplementary data are duplicated.

14. The method as claimed in claim 10, wherein the supplementary data is processed at the digital broadcasting transmitter such that the supplementary data is inserted between normal data.

15. The method as claimed in claim 10, wherein the supplementary data is Reed-Solomon (RS) encoded and interleaved without the known data and the normal data, is deinterleaved with the known data, and is RS encoded and interleaved along with the known data and the normal data, at the digital broadcasting transmitter.

16. The method as claimed in claim 10, further comprising:
- de-multiplexing in a manner of separating the input data into the normal data and the supplementary data; and
- robust data processing the separated supplementary data.

17. The method as claimed in claim 10, further comprising:
- outputting a signal a signal related to the detected location of the known data in the input data so that the demodulating and the equalizing are performed based on the output signal.

18. The method of claim 10, wherein the internal memories of the trellis encoder are set to predetermined values by the initialization.

* * * * *